United States Patent
Choi et al.

(10) Patent No.: US 7,170,777 B2
(45) Date of Patent: Jan. 30, 2007

(54) PHASE CHANGE MEMORY DEVICE AND METHOD OF OPERATING THE SAME

(75) Inventors: Sang-jun Choi, Gyeonggi-do (KR); Jung-hyun Lee, Gyeonggi-do (KR); Dong-joon Ma, Gyeonggi-do (KR); Wan-jun Park, Seoul (KR); Young-soo Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 11/193,413

(22) Filed: Aug. 1, 2005

(65) Prior Publication Data
US 2006/0092694 A1    May 4, 2006

(30) Foreign Application Priority Data
Oct. 28, 2004   (KR)   .................. 10-2004-0086539

(51) Int. Cl.
*G11C 11/00*   (2006.01)
*G11C 7/00*   (2006.01)

(52) U.S. Cl. ............. 365/163; 365/185.18; 365/185.29

(58) Field of Classification Search ................ 365/163, 365/185.18, 185.29
See application file for complete search history.

(56) References Cited

U.S. PATENT DOCUMENTS

| | | | |
|---|---|---|---|
| 6,754,107 B2 * | 6/2004 | Khouri et al. | 365/185.23 |
| 6,956,774 B2 * | 10/2005 | Lung et al. | 365/185.28 |
| 7,042,760 B2 * | 5/2006 | Hwang et al. | 365/163 |

* cited by examiner

*Primary Examiner*—Son T. Dinh
(74) *Attorney, Agent, or Firm*—Buchanan Ingersoll & Rooney PC

(57) ABSTRACT

A phase change memory device and a method of operating the same are provided. The phase change memory device may include a plurality of unit cells arranged in a matrix composed of rows and columns; a plurality of program bit lines and read bit lines arranged in rows, each of the program and read bit lines having a row selection transistor formed at one end thereof; and a plurality of program word lines and read word lines arranged in columns, each of the program and read word lines having a column selection transistor formed at one end thereof. Each of the unit cells may include a phase change resistor and an exothermal resistor used to heat the phase change resistor.

16 Claims, 3 Drawing Sheets

PHASE CHANGE MEMORY DEVICE AND METHOD OF OPERATING THE SAME

BACKGROUND OF THE DISCLOSURE

This application claims the benefit of Korean Patent Application No. 10-2004-0086539, filed on Oct. 28, 2004, in the Korean Intellectual Property Office, the disclosure of which is incorporated herein in its entirety by reference.

1. Field of the Disclosure

Embodiments of the present disclosure may include a non-volatile semiconductor memory device, and more particularly, a phase change memory device and a method of operating the same.

2. Description of the Related Art

Semiconductor memory devices are categorized into volatile memory devices and non-volatile memory (NVM) devices. Volatile memory devices, such as DRAMs, are used in, for example, computers to store and process data in a short time when power is supplied.

However, as demand for mobile phones and digital cameras increases, the demand for non-volatile memory devices increases due to their advantages over DRAMs. For example, non-volatile devices can process data in a short time, and store date even when power is no longer supplied.

Examples of non-volatile memory devices include flash memory devices, which include a stacked gate to retain electric charges. In such flash memory devices, electric charges are stored in or removed from a floating gate by tunneling via an insulator or by hot-carrier injection. However, when flash memory devices are repeatedly used, insulating characteristics of the insulator for tunneling deteriorate. As a result, the lifetime of a flash memory decreases.

In response to the above-mentioned problem, non-volatile memory devices have been developed to replace flash memory devices having stacked gates. For example, phase change memories or phase change RAMs (PRAMs) in which a change in resistivity due to phase change is used has been developed. A conventional phase change memory will now be described with reference to drawings.

FIG. 1 is an equivalent circuit diagram of a portion of a cell array of a conventional phase change memory device.

Referring to FIG. 1, each unit cell of the conventional phase change memory device includes an access transistor 10 and a phase change resistor 12. The access transistors 10 are connected to bit lines BL1 and BL2. Therefore, when the access transistors 10 are turned on, a working voltage is applied to the phase change resistors 12 via the bit lines BL1 and BL2.

Signals received by gates of the access transistors 10 from the word lines WL1 and WL2 turn the access transistors 10 on and off. As is shown in FIG. 1, the unit cells are arranged in a matrix composed of rows and columns. In this case, the word lines WL1 and WL2 form rows, and the bit lines BL1 and BL2 form columns. Therefore, a unit cell can be selected by selecting a word line and a bit line. Further, programming, reading, or erasing can be performed in the selected unit cell.

FIG. 2 is a graph illustrating a method of operating a conventional phase change memory device.

Referring to FIG. 2, a heat treatment 17 for programming a phase change memory device and a heat treatment 15 for erasing the phase change memory device are illustrated. When the phase change resistor 12 is heated to a temperature greater than its melting point (Tm) in a predetermined amount of time T1 and then is cooled down in a short time, the phase change resistor 12 transforms into an amorphous state. When the phase change resistor 12 is heated to a temperature between a crystallization temperature Tc and a meting point Tm in a predetermined amount of time T1, is maintained at the same in a predetermined amount of time T2, and then cooled down, the phase change resistor 12 is crystallized. In a conventional phase change memory device, the phase change resistor 12 is resistively heated by providing a current to both ends of the phase change resistor 12. Therefore, heat required for phase change is obtained.

The resistivity of the phase change resistor 12 varies according to whether the phase change resistor 12 is in a crystalline state or an amorphous state. In detail, the phase change resistor 12 has greater resistivity when it is in an amorphous state than when it is in a crystalline state. Therefore, data can be read in logic "0" or logic "1" by detecting current flowing through the phase change resistor 12 when a predetermined voltage applied. That is, data can be stored in a digital form, that is, logic "0" or logic "1" without the accumulation of electric charges, which is required for DRAMs or flash memory devices.

However, as is shown in FIG. 2, the erasing and programming of a phase change memory device require a high current for heating at a high temperature. Particularly, quick operation requires quick heating. Due to such a time limit, a high current must be provided to the phase change resistor 12 in a short time.

To increase the current flown to the phase change resistor 12, a high voltage must be applied to the bit lines BL1 and BL2. However, when the voltage of the bit lines BL1 and BL2 increases, a gate length of the access transistor 10 must also be increased to prevent problems, such as punch-through. Therefore, a conventional phase change memory device cannot be easily integrated due to the difficulty in reducing the size of the access transistor 10.

SUMMARY OF THE DISCLOSURE

Embodiments of the present disclosure may provide a phase change memory device with high reliability and high integrity.

Embodiments of the present disclosure may also provide a method of operating the phase change memory device.

According to an aspect of the present disclosure, there may be provided a phase change memory device including: a plurality of unit cells arranged in a matrix composed of rows and columns, a plurality of program bit lines and read bit lines arranged in rows, and a plurality of program word lines and read word lines arranged in columns.

Each of the unit cells may include a phase change resistor, and an exothermal resistor used to heat the phase change resistor. Each of the unit cells may further include a heat-conducting insulator that electrically insulates the phase change resistor from the exothermal resistor and has thermal conductivity so that heat generated by the exothermal resistor is transferred to the phase change resistor.

The program bit lines may be connected to first ends of the exothermal resistors of the unit cells along rows, and each may include a selection transistor at one end. The program word lines are connected to the other ends of the exothermal resistors of the unit cells along columns, and each may include a selection transistor at one end.

The read bit lines may be connected to first ends of the phase change resistors of the unit cells along rows, and each may include a selection transistor at one end. The read word lines may be connected to the other ends of the phase change resistors of the unit cells along columns, and each may include a selection transistor at one end.

Further, a program voltage or an erase voltage may be applied to one end of each of the program bit lines and a read voltage may be applied to one end of each of the read bit lines. The one end of the program word lines and the one end of the read word lines may be grounded. The phase change resistor may be composed of a compound containing Ge, Te and Sb.

According to another aspect of the present disclosure, there may be provided a phase change memory device including: a unit cell comprising a phase change resistor; an exothermal resistor used to heat the phase change resistor; and a heat-conducting insulator electrically insulating the phase change resistor from the exothermal resistor and having thermal conductivity; a pair of program lines respectively connected to the both ends of the exothermal resistor of the unit cell, each of the program lines comprising a selection transistor for selecting the exothermal resistor; and a pair of read lines respectively connected to the both ends of the phase change resistor, each of the read lines comprising a selection transistor for selecting the phase change resistor.

The unit cell may further include a heat-conducting insulator which electrically insulates the phase change resistor from the exothermal resistor and has thermal conductivity so that heat generated by the exothermal resistor is transferred to the phase change resistor. The heat-conducting insulator may be composed of an aluminium nitride (AlN).

According to still another aspect of the present invention, there may be provided a method of operating the phase change memory device, the method including programming, reading and erasing operations.

The programming of one of the unit cells may include: applying a program voltage to one end of the exothermal resistor of the one of the unit cells; and connecting the other end of the exothermal resistor of the one of the unit cells to a ground unit.

The reading one of the unit cells may include: applying a read voltage to one end of the phase change resistor of the one of the unit cells; and connecting the other end of the phase change resistor of the one of the unit cells to a ground unit.

The erasing one of the unit cells may include: applying an erase voltage to one end of the exothermal resistor of the one of the unit cells; and connecting the other end of the exothermal resistor of the one of the unit cells to a ground unit.

The programming of the one of the unit cells may further include: turning on the first row selection transistor of the program bit line connected to the one of the unit cells; and turning on the first column selection transistor of the program word line connected to the one of the unit cells.

The reading of the one of the unit cells may further include: turning on the second row selection transistor of the read bit line connected to the one of the unit cells; and turning on the first column selection transistor of the read word line connected to the one of the unit cells.

The erasing of the one of the unit cells may further include: turning on the first row selection transistor of the program bit line connected to the one of the unit cells; and turning on the first column selection transistor of the program word line connected to the one of the unit cells.

BRIEF DESCRIPTION OF THE DRAWINGS

The above and other features and advantages of the embodiments of the present disclosure will become more apparent by describing in detail exemplary embodiments thereof with reference to the attached drawings in which.

DETAILED DESCRIPTION OF EXEMPLARY EMBODIMENTS OF THE DISCLOSURE

Figure 1:
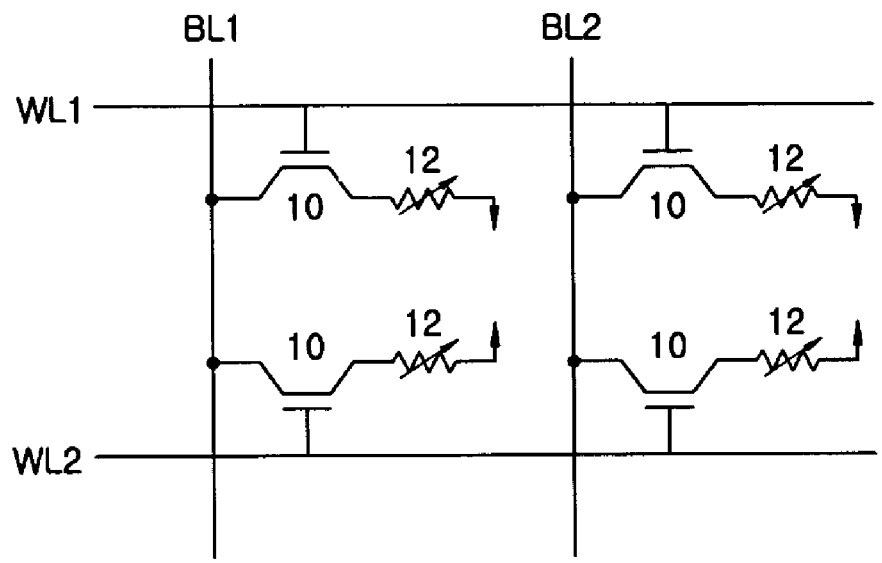
FIG. 1 is an equivalent circuit diagram of a portion of a cell array of a conventional phase change memory device.

Embodiments of the present invention will now be described more fully with reference to the accompanying drawings, in which exemplary embodiments of the disclosure are shown. The invention may, however, be embodied in many different forms and should not be construed as being limited to the embodiments set forth herein. In the drawings, elements are exaggerated for clarity.

Figure 3:
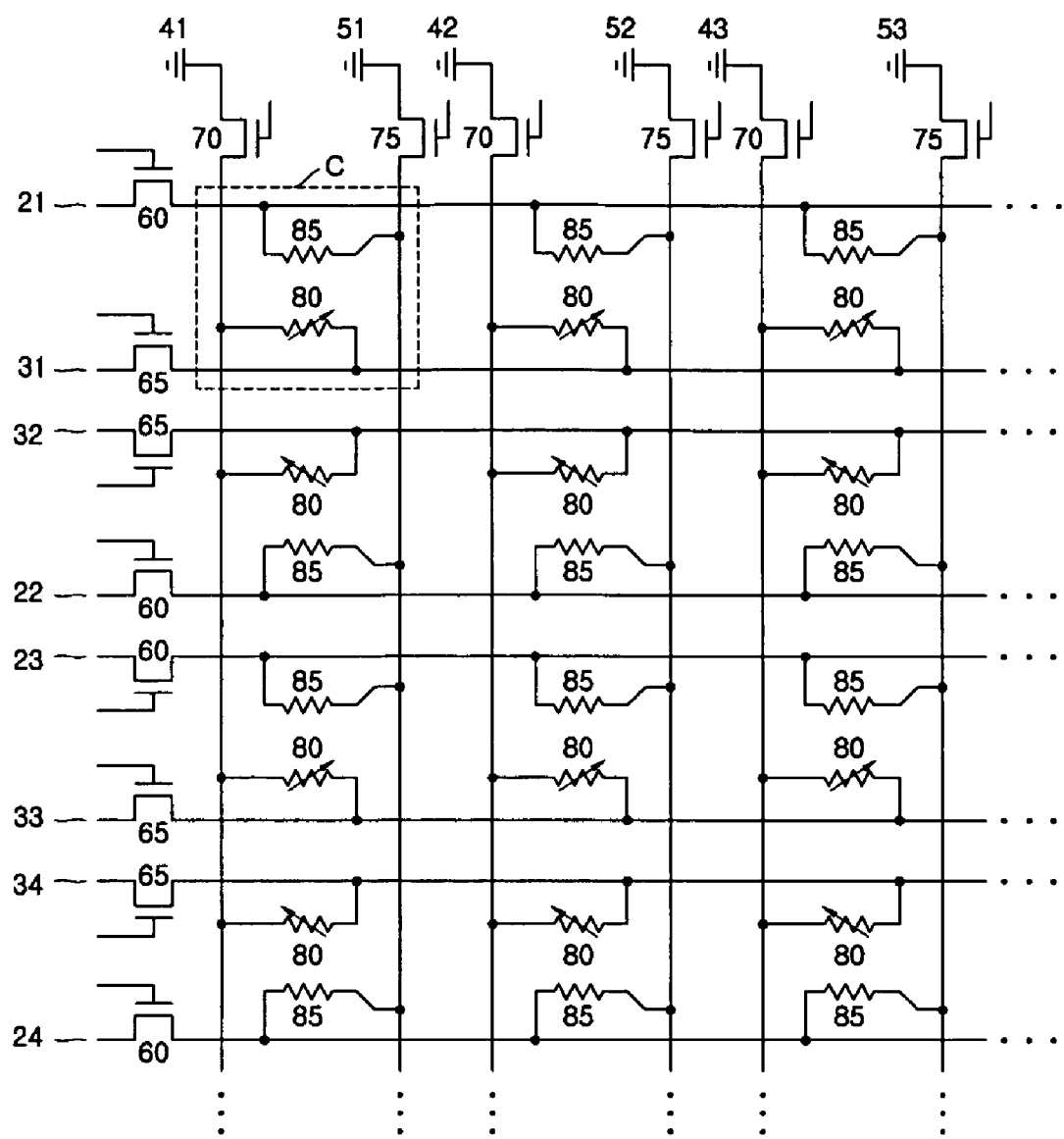
FIG. 3 is an equivalent circuit diagram of a portion of a cell array of a phase change memory device according to an embodiment of the present disclosure.

FIG. 3 is an equivalent circuit diagram of a portion of a cell array of a phase change memory device according to an embodiment of the present disclosure.

Referring to FIG. 3, the cell array may include a plurality of unit cells C arranged in a matrix composed of rows and columns; a plurality of program bit lines 21, 22, 23, and 24 and a plurality of read bit lines 31, 32, 33 and 34 extending along rows; and a plurality of read word lines 41, 42 and 43 and a plurality of program word lines 51, 52 and 53 extending along columns.

In this case, the number of the unit cells C, and the numbers of the program bit lines 21, 22, 23 and 24, the read bit lines 31, 32, 33 and 34, the read word lines 41, 42 and 43, and the program word lines 51, 52 and 53 connected to the unit cells C may vary according to a memory capacity.

Each of the unit cells C may include a phase change resistor 80 and an exothermal resistor 85. The exothermal resistor 85 may function as a heat supplier to provide heat to the phase change resistor 80. The unit cell C will now be described in further detail.

Figure 4:
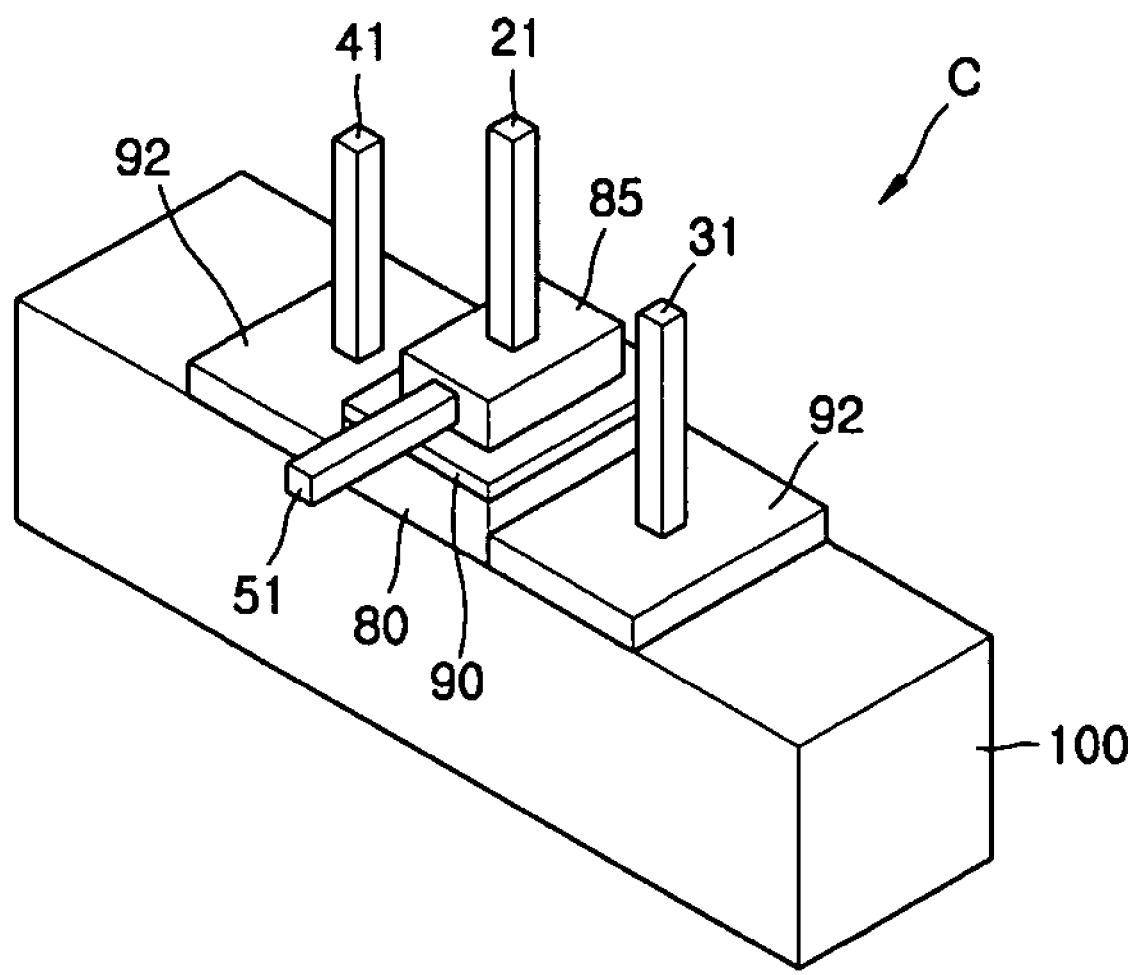
FIG. 4 is a perspective view of a unit cell of the phase change memory device shown in FIG. 3.

FIG. 4 is a perspective view of one of the unit cells C of the phase change memory device shown in FIG. 3.

Referring to FIG. 4, the exothermal resistor 85 may be connected to a program bit line 21 and a program word line 51. The exothermal resistor 85 may be resistivity-heated by a current which flows from the program bit line 21 to the program word line 51. The exothermal resistor 85 may be composed of a metal which has a high melting point and can discharge a large amount of thermal energy. For example, the exothermal resistor 85 may be composed of tungsten (W). The exothermal resistor 85 may be heated to perform programming or erasing operation, which will be described later.

In addition, the ends of the phase change resistor 80 may be connected to the read bit line 31 and the read word line 41 through a connection pad 92. The connection pad 92 may be a metal pad. The phase change resistor 80 may be composed of a material having two stable states having different electrical resistivities. In detail, the phase change resistor 80 may be composed of a compound containing Ge, Te and Sb. Hereinafter, the compound containing Ge, Te and Sb will be referred to as GST.

Figure 2:
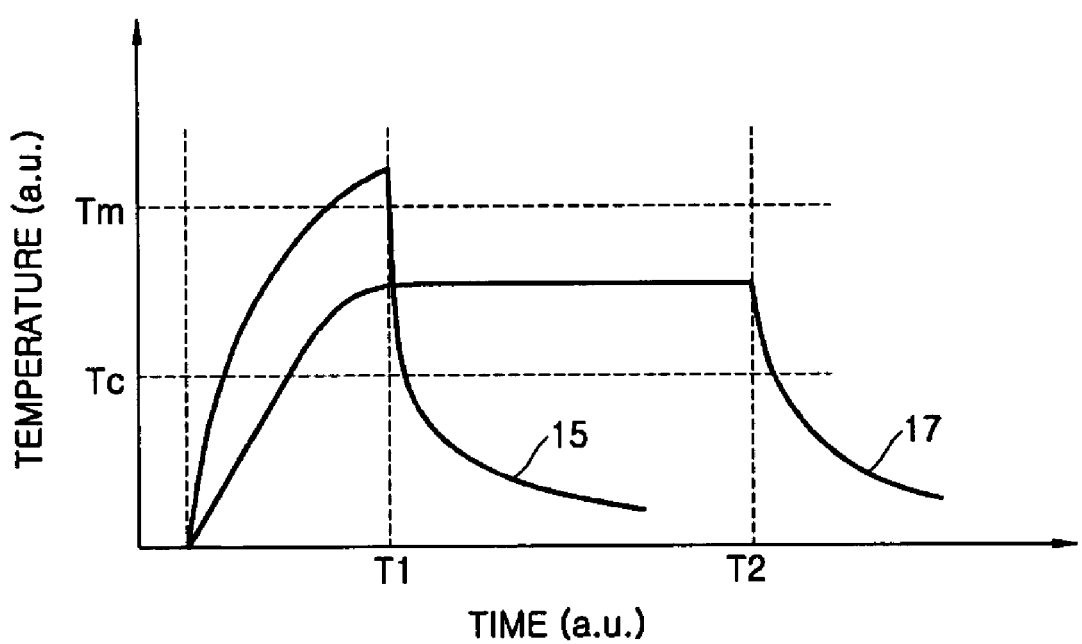
FIG. 2 is a graph illustrating a method of operating a conventional phase change memory device.

As described with reference to FIG. 2, the phase change resistor 80, preferably composed of GST, may be in an amorphous state or a crystalline state at room temperature according to a heat treatment performed thereon. Amorphous GST has higher resistivity than crystalline GST. Therefore, a current flowing through the phase change transistor will vary according to the state of the phase change resistor 80. Since there may be two states, the current flowing through the phase change resistor 80 may represent two different values, thus enabling digital storage of logic "0" and logic "1".

For example, the crystalline state of the phase change resistor 80 may be a program state indicating "1", and the amorphous state of the phase change resistor 80 may be an erase state indicating "0". An erase voltage by which the phase change resistor 80 may be transformed into an amorphous state that may be higher than a program voltage. Whether the phase change resistor 80 may be in the program state or the erase state is determined by a current flowing through the phase change resistor 80, that is, a current flowing from the read bit line 31 to the read word line 41.

Referring to FIG. 4, a heat-conducting insulator 90 may further formed between the exothermal resistor 85 and the phase change resistor 80. The exothermal resistor 85 may be insulated from the phase change resistor 80 by the heat-conducting insulator 90. Therefore, the programming and erasing operations through the exothermal resistor 85 may be separated from the reading operation through the phase change resistor 80, which will be described later.

In addition, the heat-conducting insulator 90 may have high thermal conductivity such that heat generated by resistivity-heating the exothermal resistor 85 may be transferred to the phase change resistor 80. For example, the heat-conducting insulator 90 may be composed of an aluminium nitride (AlN).

The connections of a unit cell array will now be described with reference to FIG. 3. Referring to FIG. 3, the program bit lines 21, 22, 23 and 24 may be connected to first ends of the exothermal resistors 85 of the unit cells C along rows. A row selection transistor 60 may be formed at one end of each of the program bit lines 21, 22, 23 and 24 in order to select a row.

The program word lines 51, 52 and 53 may be connected to the other ends of the exothermal resistors 85 of the unit cells C along columns. A column selection transistor 75 may be formed at one end of each of the program word lines 51, 52 and 53 in order to select a column.

Therefore, one of the unit cells C can be selected by turning on the row selection transistors 60 connected to the program bit line 21, 22, 23 or 24 connected to the selected unit cell C and the column selection transistor 75 connected to the program word line 51, 52 or 53 connected to the selected unit cell C.

In other words, one of the specific unit cells C may be selected by selecting a program bit line and a program word line. For example, the unit cell C arranged in a first row and in a first column may be selected by turning on the row selection transistor 60 connected to the program bit line 21 and turning on the column selection transistor 75 connected to the program word line 51.

After selecting one of the unit cells C, the exothermal resistor 85 may be heated by applying the program or erase voltage to one end of the program bit lines 21, 22, 23 and 24 and connecting the program word lines 51, 52 and 53 to a ground unit. Therefore, the phase change resistor 80 may be heated by heat conducted from the exothermal resistor 85, and, as shown in FIG. 2, the programming or erasing operation may be performed one of heat treatments 15 and 17.

Alternatively, the program or erase voltage may be applied to the program word lines 51, 52 and 53, and the program bit lines 21, 22, 23 and 24 may be connected to the ground unit.

The read bit lines 31, 32, 33 and 34 may be connected to first ends of the phase change resistors 80 of the unit cells C along rows. A row selection transistor 65 may be formed at one end of each of the read bit lines 31, 32, 33 and 34 in order to select a row.

The read word lines 41, 42 and 43 may be connected to the other ends of the phase change resistors 80 of the unit cells C along columns. A column selection transistor 70 may be formed at one end of each of the read word lines 41, 42 and 43 in order to select a column.

Therefore, as is described with the programming operation, one of the unit cells C may be selected by turning on the row selection transistor 65 connected to the read bit line 31, 32, 33 or 34 connected to the selected unit cell C and the column selection transistor 70 connected to the read word line 41, 42 or 43 connected to the selected unit cell C.

After selecting one of the unit cells, the resistivity of the phase change resistor 80 of the selected unit cell C may be determined by applying a read voltage to one end of the read bit lines 31, 32, 33 and 34 and connecting the read word lines 41, 42 and 43 to a ground unit and reading the resulting current. Since the resistance indicates whether the phase change resistor 80 is in a crystalline state or an amorphous state, the stored date can be read.

Alternatively, the read voltage can be applied to the read word lines 41, 42 and 43, and the read bit lines 31, 32, 33 and 34 may be connected to the ground unit.

As is mentioned above, a unit cell C of the phase memory device according to the present embodiment does not include a selection transistor, and can be operated by only the selection transistors 60, 65, 70 75 formed at one end of a row or a column. Therefore, the number of transistors of the phase change memory device according to the present embodiment may be decreased relative to a conventional phase change memory device having the same memory capacity.

In addition, conventionally, it may be very difficult to reduce the size of a unit cell because the size of a transistor included in the unit cell cannot be reduced. Therefore, a conventional phase change memory device cannot provide high integrity. On the other hand, the size of a unit cell C according to an embodiment of the present disclosure can be substantially reduced because the unit cell C does not include a transistor. In this case, row or column selection transistors 60, 65, 70 and 75 are highly reliable by retaining a sufficient gate length suitable for preventing punch-through characteristics. Therefore, a phase change memory device according to an embodiment of the present invention may have high reliability and high integrity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A phase change memory device comprising:
  a plurality of unit cells arranged in a matrix composed of rows and columns on a semiconductor substrate, each of the unit cells comprising a phase change resistor and an exothermal resistor used to heat the phase change resistor;

a plurality of program bit lines connected to first ends of the exothermal resistors of the unit cells along rows, each of the program bit lines comprising a first row selection transistor at one end;

a plurality of program word lines connected to the other ends of the exothermal resistors of the unit cells along columns, each of the program word lines comprising a first column selection transistor at one end;

a plurality of read bit lines connected to first ends of the phase change resistors of the unit cells along rows, each of the read bit lines comprising a second row selection transistor at one end; and a plurality of read word lines connected to the other ends of the phase change resistors of the unit cells along columns, each of the read word lines comprising a second column selection transistor at one end.

2. The phase change memory device of claim 1, wherein each of the unit cells further includes a heat-conducting insulator which electrically insulates the phase change resistor from the exothermal resistor and has thermal conductivity so that heat generated by the exothermal resistor is transferred to the phase change resistor.

3. The phase change memory device of claim 2, wherein the heat-conducting insulator comprises an aluminium nitride (AlN).

4. The phase change memory device of claim 1, wherein a program voltage or an erase voltage is applied to first ends of the program bit lines and a read voltage is applied to first ends of the read bit lines.

5. The phase change memory device of claim 4, wherein the first ends of the program bit lines and the first ends of the read word lines are grounded.

6. The phase change memory device of claim 1, wherein the phase change resistor comprises a compound containing Ge, Te and Sb.

7. A phase change memory device comprising:

a unit cell comprising a phase change resistor; an exothermal resistor used to heat the phase change resistor; and a heat-conducting insulator electrically insulating the phase change resistor from the exothermal resistor and having thermal conductivity;

a pair of program lines respectively connected to the both ends of the exothermal resistor of the unit cell, each of the program lines comprising a selection transistor for selecting the exothermal resistor; and a pair of read lines respectively connected to the both ends of the phase change resistor, each of the read lines comprising a selection transistor for selecting the phase change resistor.

8. The phase change memory device of claim 7, wherein the unit cell further comprises a heat-conducting insulator which electrically insulates the phase change resistor from the exothermal resistor and has thermal conductivity so that heat generated by the exothermal resistor is transferred to the phase change resistor.

9. The phase change memory device of claim 8, wherein the heat-conducting insulator comprises an aluminium nitride (AlN).

10. The phase change memory device of claim 7, wherein the pair of program lines are connected to a program power source and a ground unit, respectively, and the pair of read lines are connected to a read voltage and a ground unit, respectively.

11. The phase change memory device of claim 7, wherein the pair of program lines are connected to an erase power source and a ground unit, respectively, and the pair of read lines are connected to a read voltage and a ground unit, respectively.

12. The phase change memory device of claim 7, wherein the phase change resistor comprises a compound containing Ge, Te and Sb.

13. A method of operating the phase change memory device of claim 1, the method comprising:

programming one of the unit cells comprising:
applying a program voltage to one end of the exothermal resistor of the one of the unit cells; and
connecting the other end of the exothermal resistor of the one of the unit cells to a ground unit;

reading one of the unit cells comprising:
applying a read voltage to one end of the phase change resistor of the one of the unit cells; and
connecting the other end of the phase change resistor of the one of the unit cells to a ground unit; and erasing one of the unit cells comprising:
applying an erase voltage to one end of the exothermal resistor of the one of the unit cells; and
connecting the other end of the exothermal resistor of the one of the unit cells to a ground unit.

14. The method of claim 13, wherein the programming of the one of the unit cells further comprises:

turning on the first row selection transistor of the program bit line connected to the one of the unit cells; and
turning on the first column selection transistor of the program word line connected to the one of the unit cells.

15. The method of claim 13, wherein the reading of the one of the unit cells further comprises:

turning on the second row selection transistor of the read bit line connected to the one of the unit cells; and
turning on the first column selection transistor of the read word line connected to the one of the unit cells.

16. The method of claim 13, wherein the erasing of the one of the unit cells further comprises:

turning on the first row selection transistor of the program bit line connected to the one of the unit cells; and
turning on the first column selection transistor of the program word line connected to the one of the unit cells.

* * * * *